United States Patent

[11] 3,573,794

[72] Inventor Malcolm D. Widenor
Sea Cliff, N.Y.
[21] Appl. No. 637,698
[22] Filed May 11, 1967
[45] Patented Apr. 6, 1971
[73] Assignee North Atlantic Industries, Inc.
Plainview, N.Y.

[54] ANALOG/DIGITAL PROCESSING TECHNIQUES
10 Claims, 4 Drawing Figs.

[52] U.S. Cl. 340/347
[51] Int. Cl. H03k 13/20
[50] Field of Search 340/347; 235/194; 324/99

[56] References Cited

UNITED STATES PATENTS

| | | | |
|---|---|---|---|
| 2,988,737 | 6/1961 | Schroeder | 340/347 |
| 3,127,601 | 3/1964 | Kaenel | 340/347 |
| 3,136,987 | 6/1964 | Bock et al. | 340/347 |
| 3,142,834 | 7/1964 | Falk et al. | 340/347 |
| 3,201,781 | 8/1965 | Holland | 340/347 |
| 3,215,825 | 11/1965 | Birnbaum et al. | 235/194 |
| 3,226,710 | 12/1965 | Tripp | 340/347 |
| 3,255,448 | 6/1966 | Sadvary et al. | 340/347 |
| 3,295,126 | 12/1966 | Spady | 340/347 |
| 3,443,226 | 5/1969 | Knight | 324/99 |

*Primary Examiner*—Thomas A. Robinson
*Assistant Examiner*—Gary R. Edwards
*Attorney*—Morgan, Finnegan, Durham and Pine

ABSTRACT: Systems for processing analog and digital data are disclosed herein and include techniques for converting analog data to digital data (*a* to *d*) and vice versa (*d* to *a*), as well as error-detection processing for optimizing system response. Several *a*/*d* systems are illustrated, one employing an AC analog input to a comparator which is coupled to a null detector system employing a voltage-to-frequency converter for supplying null responsive signals to a digitizer; another of the systems is of comparable configuration but employs a multiplier-integrator combination in the null detector system without utilizing voltage-to-frequency conversion. A third system of generally similar configuration utilizes both the multiplier-integrator and the voltage/frequency conversion circuits. Provisions are also made for threshold control and other response shaping functions.

INVENTOR.
MALCOLM D. WIDENOR
BY
Morgan, Finnegan, Durham & Pine
ATTORNEYS.

INVENTOR.
MALCOLM D. WIDENOR
BY
Morgan, Finnegan, Durham & Pine
ATTORNEYS

ANALOG/DIGITAL PROCESSING TECHNIQUES

This application is related to the following prior copending applications owned by the assignee of the instant application:

Application of: John B. Heaviside and Franklin W. Smith, Jr.
Ser. No. 353,558
Filed: Mar. 20, 1964
For: Data Processing Application of: John B Heaviside
Ser. No. 435,149
Filed: Feb. 25, 1965
For: Control Techniques.

This application concerns analog/digital systems and is related to error-signal detection and processing techniques—particularly, but not exclusively, pertinent to analog/digital and digital/analog converters as well as other interface systems.

In many interface processing systems a comparator is employed which compares analog and digital data and provides an output signal varying as a function of the comparison of these two inputs.

One common comparator application which is useful in illustrating certain techniques and advantages of the invention, is that involving an analog-to-digital converter wherein analog inputs are compared in a comparator with locally generated digital data. Correspondence or lack of correspondence between the two inputs is reflected in an AC analog error signal. Typically, the error signal is at a null when the analog and digital signals are in correspondence.

In many applications it is desired that the condition of the error signal be evaluated as rapidly as possible, for control, monitoring or measurement purposes.

Noise, harmonics, quadrature and other spurious conditions make such rapid evaluation difficult unless one is prepared to sacrifice accuracy. The use of filters for cleaning up the error signal is not a wholly satisfactory solution since these filters introduce delays in system response. Sampling the null signal with a small aperture time improves response time, but compromises accuracy. Whereas such sampling techniques have an accuracy limited to the range of 0.05 percent to 0.1 percent, the system according to the invention is capable of realizing accuracies greater by an order of magnitude or more.

The problem of eliminating noise can also be mitigated in digitizing systems by employing counters for updating with the least significant digit. However, the response is only optimum in the special case of small data changes and is otherwise relatively slow.

To illustrate the short-coming, consider the case of a BCD Resolver Bridge having a full scale of 359.999° and a least significant digit of 0.001° (i.e. a resolution of 0.001°); for an input change of 180° and with a clock frequency of 10 kHz., it will take 180,000 counts or 18 seconds to reach a null.

It is accordingly an object of the invention to improve error detection techniques and particularly, to improve the speed of detection of the error signal in interface systems without compromising accuracy.

A further object of the invention is to improve the speed of error detection over a wide range of input rate changes.

A more specific object of the invention is to provide fast acting, accurate null detection notwithstanding the presence of noise, harmonics, quadrature and the like.

A further source of degradation in the performance of interface systems involves the delay associated with the digitizing of the error signal, whether in AC or DC form. Increase speed is generally attained only by sacrificing accuracy or simplicity.

The problem may be appreciated by considering those systems which use an error controlled up-down counter. In many applications, the counter is controlled by a gated clock running at a predetermined rate. An error signal exceeding a predetermined value causes the counter to count or update its least significant digit in the direction dictated by the polarity of the error.

Since the counter is clock-controlled, its maximum count and therefore data rate is fixed—in some cases to one value, and in others to one of several available values depending on the magnitude of the error.

In any event, such a system, lacking a widely and continuously adjustable range of response rates, can not accurately track the wide and continuously variable input analog rates characterizing many systems.

While a particular dynamic condition of the input may fit the capabilities of the rate-determining means of the counter, many input rate conditions will be higher, thereby causing a lag in updating, and attendant errors due to poor tracking of the inputs to the comparator.

Establishing a higher rate of counter operation will not suffice since low-frequency analog changes may then produce overshoot or other undesirable transients. Establishing a minimum and maximum counter rate is not an adequate solution for the same basic reason.

If on the other hand, as is frequently done, the counter is gated for a single clock pulse following each decision, then the system will track the slowest of rates but will not track for rates requiring updating by more than one least-significant digit per decision. Rate inputs which exceed this figure will cause the dynamic lag to increase with time giving rise to a condition sometimes known as loss of synchronism.

The same general shortcomings characterize multimode counter control systems which attempt some compromise by causing the selection of bit weight to be determined by the magnitude of the error signal. Less-than-optimal response occurs in such arrangements except for those special input cases which correspond with the available updating capabilities. Accuracy and smoothness of tracking accordingly suffer.

It is accordingly a further object of the invention to provide improvements in the digitizing of analog signals and particularly to improve the speed of the digitizing process without compromising accuracy.

A further object of the invention is to provide rapid synchronization time and improved tracking capability in interface systems while preserving high accuracy. Further objects of the invention are to provide smooth and accurate tracking in interface systems for both high and low analog data rates, and to provide analog/digital converter systems with dynamic performance capabilities similar to that provided in closed loop analog servomechanisms.

Other objects and advantages of the invention will be set forth in part hereinafter and in part will be obvious herefrom or may be learned by practice with the invention, the same being realized and attained by means of the instrumentalities pointed out in the appended claims.

The foregoing objects and advantages are attained in accordance with the invention which consists of the novel parts, combinations, arrangement, instrumentalities, techniques and processes hereinafter described.

Generally speaking, the invention comprises novel techniques for processing AC error signals to obtain rapidly a true error indication notwithstanding noise, harmonics, quadrature, DC components and the like, and an amplitude-to-frequency conversion arrangement for use in both AC and DC digitizers for achieving rapid digitizing rates, which are both smooth and continuous within the resolution of the system. The invention further contemplates a combination of these techniques to achieve fast and accurate system response.

Serving to illustrate exemplary embodiments of the invention are the drawings of which:

GENERAL SYSTEM CHARACTERISTICS

Figure 1:
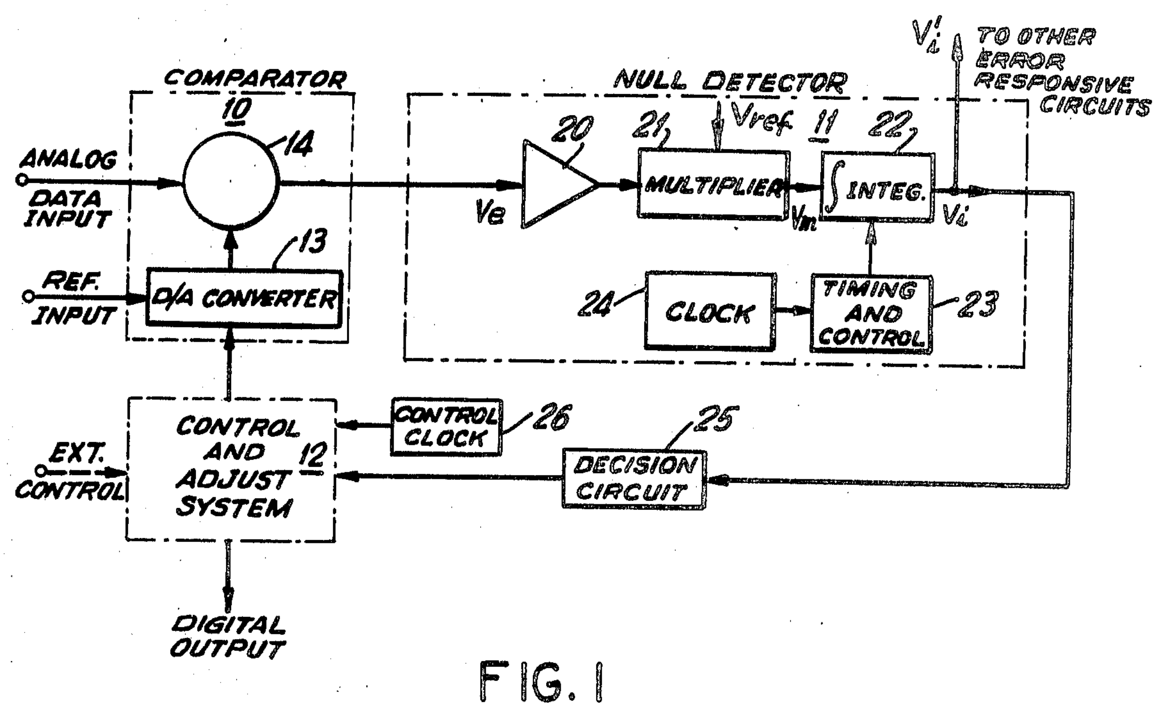
FIG. 1 is a schematic diagram illustrating the application of null detector techniques according to the invention to analog/digital converters.

The analog/digital system of FIG. 1 illustrates a typical application of the null detector technique according to the invention.

Such a system broadly includes a comparator, 10, the output of which is evaluated in a null detector, 11, for controlling a decision circuit 25.

The decision circuit controls in turn a control/adjust system, 12, which develops digital data under control of the decision circuit response to the null detector output.

Timing functions and mode control for the control/adjust system may be supplied by a control clock 26. The developed digital data is fed to the comparator 10 where it is converted into an equivalent analog signal which is compared with the independent analog input.

Initially, the digital data does not correspond with the analog input, and an out-of-null condition prevails resulting in an error signal $V_e$. The latter is processed in the null detector to produce signals which drive the digital mechanisms in the control/adjust stages 12 until correspondence between the analog input and digital data is obtained. At this time the error signal $V_e$ falls below its minimum effective control level and the digital indication is available for readout.

There are a wide range of systems of the general nature of FIG. 1.

The system may be a converter of the bridge-type such as shown in the above-mentioned copending applications wherein the analog input comprises synchro or resolver data, the comparator employs a bridge, and the control/adjust unit is of the successive-approximation type.

Alternatively, the system may be of the shaft-to-digital converter type wherein the analog input is embodied as a shaft angle, the comparator includes a rotatable electromagnetic transducer 14 such as a resolver which is positioned by the shaft angle input, and the control/adjust system includes an up-down counter operated by the error signal to null the comparator and derive the digital output. In this system, the analog source *d/a* converter 13 is a sine/cosine function generator controlled by the counter; it supplies sine/cosine voltages to the windings of the transducer 14.

The analog data input to comparator 10 may also take the form of two inputs, a shaft angle position used to position the transducer 14, and analog data voltages applied to the windings thereof. In this case, the algebraic sum or difference of the two inputs is digitized. Where the transducer excitation is fixed, the digitized input can be regarded as the shaft position referred to the angle represented by the fixed excitation. Accordingly, as used herein input analog data may take the form of an AC signal such as a linear AC signal or a carrier such as the type that carries analog or resolver data, or the analog data may be in the form of a mechanical input, for example, a shaft angle position.

Where shaft angle is not a variable, as in the case of a transducer embodied as a summing transformer, the excitation thereof represents the analogue quantity which is to be digitized. Such arrangements are frequently referred to as AC ratiometers and source converter 13 thereof is generally of the type which provides a linear relationship between the digital input and the analog output.

There are many variations in the basic components of FIG. 1. Some employ multiple transducers to provide conversions of multispeed analog data. In addition to "successive approximation," "count-up/down," and other types of control systems, combinations of these techniques are used, sometimes with each system being assigned to a specific function, e.g. synchronization or tracking. The control/adjust system may also include provisions for modifying system operation as a function of input data rates, error amplitude, and the like.

FIG. 1 also represents systems having provisions for external control inputs ("Ext. Control" in FIG. 1) applied to the control/adjust section 12. When the system is thus programmed, the error signal $V_e$ is indicative of the relationship between the analog input and the programmed input or command.

The external control feature permits the introduction of predicted data to hasten the conversion action and is especially useful in handling high speed multiplexed inputs. A storage arrangement (not shown) is required for this mode of operation.

Where the system updates the digital representation periodically, the external control circuit affords means for filling in data between updating intervals to realize smooth performance.

FIG. 1 also illustrates the use of the processed null detector signal $V_i^1$ to control other error-responsive circuits, e.g. an analog servo coupled to the transducer 14 and used to control the latter. During this mode, the control and adjust section 12 is disabled.

NULL DETECTOR

As shown in FIG. 1, the null detector receives the error signal output $V_e$ from the comparator 10. The signal, in AC form, is amplified in amplifier 20 and applied to a multiplier 21.

The latter also receives a reference voltage $V_{ref}$ of the same frequency as the fundamental of $V_e$. The multiplier 21 may be of any appropriate known type, many of which are employed in the analog computer art. A recent multiplier is described in U.S. Pat. No. 3,215,825.

Figure 2:
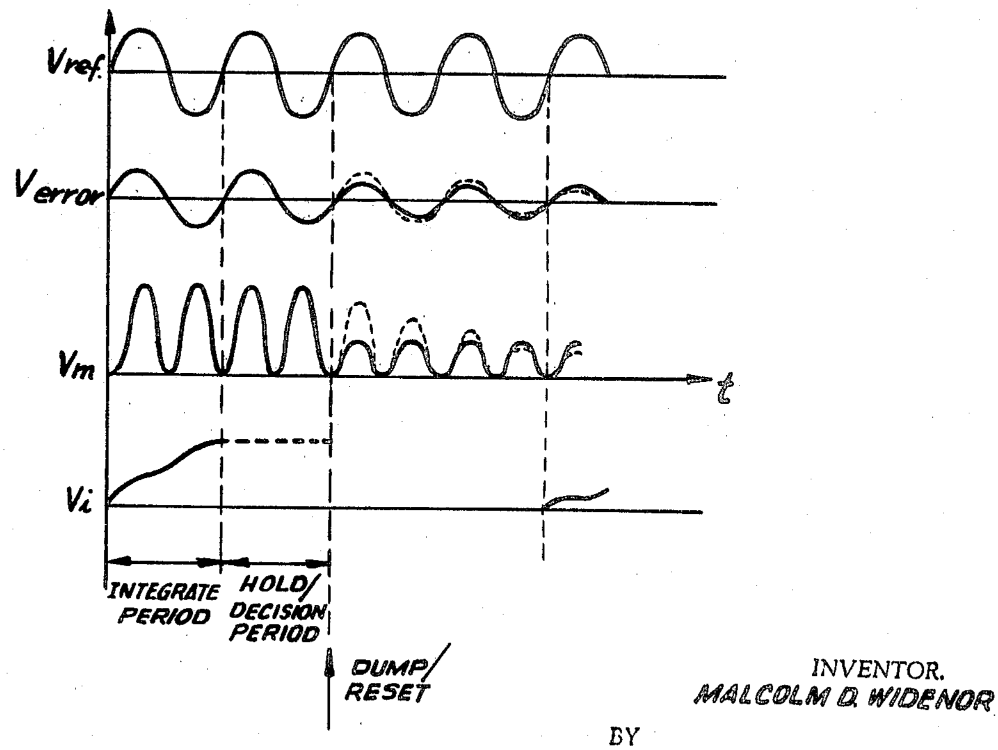
FIG. 2 is a plot of signal wave forms useful in explaining the operation of the system of FIG. 1.

The multiplier output $V_m$ represents the instantaneous product of $V_e$ and $V_{ref}$ which is a $Sin^2$ function having a frequency twice that of $V_e$ and $V_{ref}$. Idealized waveforms showing $V_e$, $V_{ref}$ and $V_m$ are illustrated in FIG. 2. The response of the error signal $V_e$ for the case of a system which updates continuously is indicated in dotted lines while one reflecting a partial fixed updating following each hold/decision period is shown in solid lines. The same two types of response are reflected in the solid and dotted lines of the $V_m$ waveform.

Since $V_{ref}$ is of constant amplitude, and substantially free of distortion or other undesired voltage components, the average value of $V_m$ is proportional to the error signal.

The signal $V_m$ is integrated in an integrator 22 to yield an integrated signal $V_i$. This arrangement is based on the fact that the process of multiplying the error signal by a clean constant amplitude reference of the same frequency and then integrating the product over an integral member of full cycles, yields a signal which is free of noise, harmonics, DC components and quadrature. Moreover, for a ½cycle integration period, all odd harmonics vanish providing a significant filtering advantage.

This result is exploited to produce a clean DC error signal in an extremely short period by keying the integrator from a suitable timing and control circuit 23 to carry out an integration, preferably for 1 cycle, but alternatively for a ½cycle or a number of full cycles. The resultant signal is then used to control the decision circuit 25 which in response causes the digital values generated in the control/adjust system 12 to change in a manner which brings the digital data into correspondence with the analog data. Nulling of the error signal $V_e$ results, followed by readout of the digital value.

The above operations are reflected in the waveforms shown in FIG. 2. $V_i$ is shown as being the resultant of integrating $V_m$ for a full cycle. The decision circuit updates the digital circuits during the ensuing hold/decision interval and during this interval $V_i$ is stored, e.g. with the aid of a long RC circuit.

At the end of the decision period the integrator, which may be an averaging arrangement of any appropriate conventional design, e.g. a gated RC circuit or an operational amplifier with capacitive feedback, is reset and a second integration undertaken after an appropriate delay.

The timing and control circuits which establish the foregoing modes may be controlled by a timing clock 24 synchronized with the error signal carrier. Circuit 23, where required, may be of any convenient form and can advantageously employ a simple timed switch combination together with circuits for storing the integrated signal at the end of the integrate period and then discharging the storage circuit at the end of the decision period. A conventional integrating operational amplifier with its hold and reset switch arrangement is adapted to achieve both the desired integrations and the requisite hold and reset.

As noted previously, the control/adjust system 12 can be any one of several types. In the case of the successive-approximation type system, the decision circuit 25 supplies an accept or reject pulse which controls the storage or discarding of the trial digits starting with the most significant bit.

In the case of a count up/down type control system, the decision circuit can instruct the counter in 12 to count up, count down, or stop count.

In the case where a multifrequency control clock 26 is used, the decision circuit can also instruct the counter in 12 to count at an appropriate rate.

ERROR PROCESSING WITH VOLTAGE-TO-FREQUENCY CONVERTER

Figure 3:
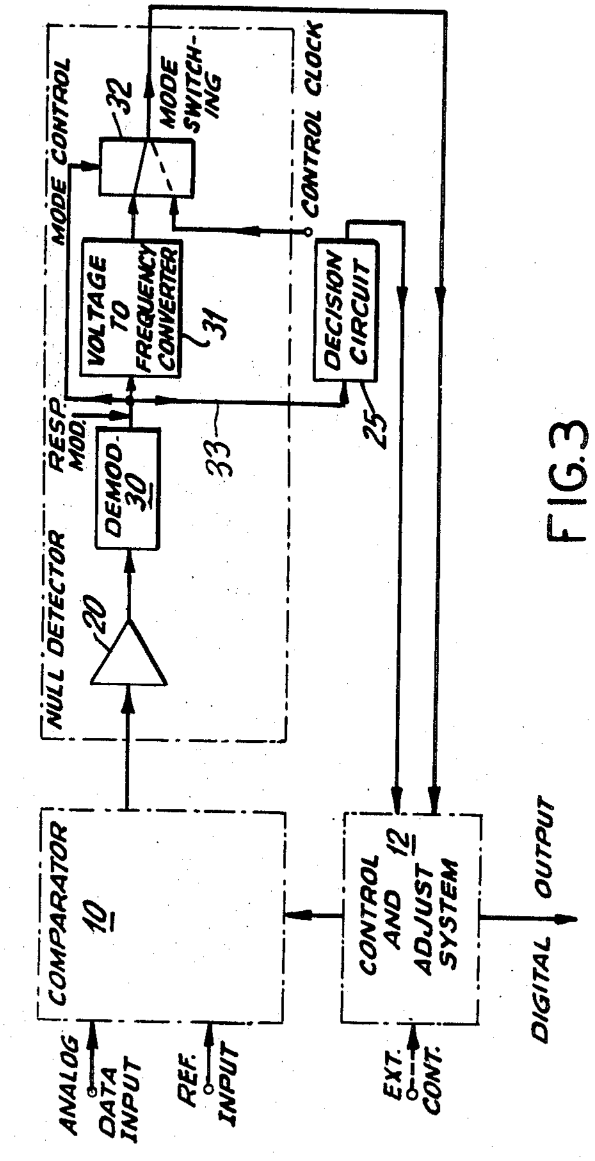
FIG. 3 is a schematic block diagram illustrating additional null detection and processing techniques in an analog/digital converter, including the technique of converting error signal amplitude into a variable frequency signal.

The voltage-to-frequency conversion technique is illustrated in FIG. 3 in an analogue-to-digital converter system. General system characteristics are as discussed in connection with FIG. 1. A comparator 10 is used to compare the analog and digital inputs. The resultant error signal is fed to amplifier 20 and demodulated in a demodulator 30 which may typically be a phase sensitive type, multiplier or peak detector. The detected modulation is applied to a voltage-to-frequency converter 31 which may be of any appropriate construction. A recent U.S. Pat. No. 3,219,945 illustrates one such circuit.

The variable frequency output pulses derived from converter 31 are applied via a mode control switch 32 to the digitizing circuits of the control and adjust system 12. Since the pulse rate originating in the converter 31 is proportional to error signal amplitude, then the digitizing circuits in system 12 will respond rapidly for high amplitude errors and more slowly for lower amplitude errors, thereby providing improved tracking. In an exemplary embodiment, the pulses may be directed to the generator of the least significant digit of the counter in the control/adjust section 12 thereby producing rapid counting where large corrections are required and lower counting otherwise. This overcomes the disadvantages mentioned hereinbefore which are associated with digitizers operating at one rate or a selected one of several rates.

In the mode of operation illustrated in FIG. 3, the system is analogous to a closed loop servo and because of the electronic nature of the digitizing process, it has performance capabilities even greater than those involving servos with relatively high inertia loads. Being analogous to closed loop servos, the arrangement of FIG. 3 is also amenable to the various velocity and rate response improving techniques (integral and derivative control, lead-lag compensation, rate stabilization, etc.) developed in the servomechanism art. This feature is schematically indicated by the notation RESP. MODIFIC. in FIG. 3.

If the converter 31 is polarity sensitive such that the polarity of the variable frequency pulses reverses with a reversal in error signal polarity, and if the digitizer 12 employs a counter, then the output of converter 31 alone can be used to control an up/down counter with a polarity sensitive circuit employed to control direction. Otherwise either a one-way counter must be employed or an error polarity sensitive circuit must be employed. The latter comprises a coupling circuit 53 which supplies a signal to decision circuit 25 to produce a counter direction control signal which is a function or error signal polarity and the latter signal is fed along with the counter pulsing signal from converter 31 to the control and adjust system 12.

When using the voltage-to-frequency converter, a difficulty may arise when data is changing at very low rates. Under this condition, the error voltage applied to the voltage-to-frequency converter can drop below the threshold of operation of the converter. This is not a problem for the more sophisticated systems used for voltage-to-frequency conversion but for a simple low cost converter, signals below the threshold of say 2—5 percent of full scale, put out random pulses or sometimes no pulses at all. The effect of this is to make the tracking of very low data rates erratic or jumpy. On the other hand, spurious operation can also result where the sensitivity of the converter is high relative to overall system resolution. Both conditions may create the desirability for mode change.

The arrangement of FIG. 3 illustrates such mode changing and may employ a bit-by-bit tracking system in conjunction with the voltage-to-frequency converter, the former being operable when the error signal falls below the threshold of the frequency converter. The decision circuit 25 in this case provides the data for controlling the control/adjust system 12.

This feature is schematically illustrated in FIG. 3 by way of the mode control switch 32 which may be a threshold gate actuated when the error signal falls below the threshold of converter 31. When actuated, the switch transfers the pulsing input of the control/adjust system 12 from the converter 31 to a source of clock count pulses. The decision circuit continues to supply counter control signals which determined whether or not to count and in what direction.

Although a switch or gate 32 is shown being actuated directly by the demodulated error signal, its mode changing function may be accomplished by other known techniques and circuits including those involved in the voltage-to-frequency conversion circuit 3.

Moreover, the converter itself may be designed to supply clock pulses automatically when the threshold level is not attained by the error signal. In this case, an extrinsic mode switch is not required.

The demodulation 30 of FIG. 3 may be arranged in the manner taught in FIGS. 1, 2. In this event, the system of FIG. 3 includes the advantages of that detector as well. Additionally, demodulation 30 may comprise two demodulator types, each selected according to the mode requiring its characteristics. One type may be as shown in FIGS. 1 and 2.

Figure 4:
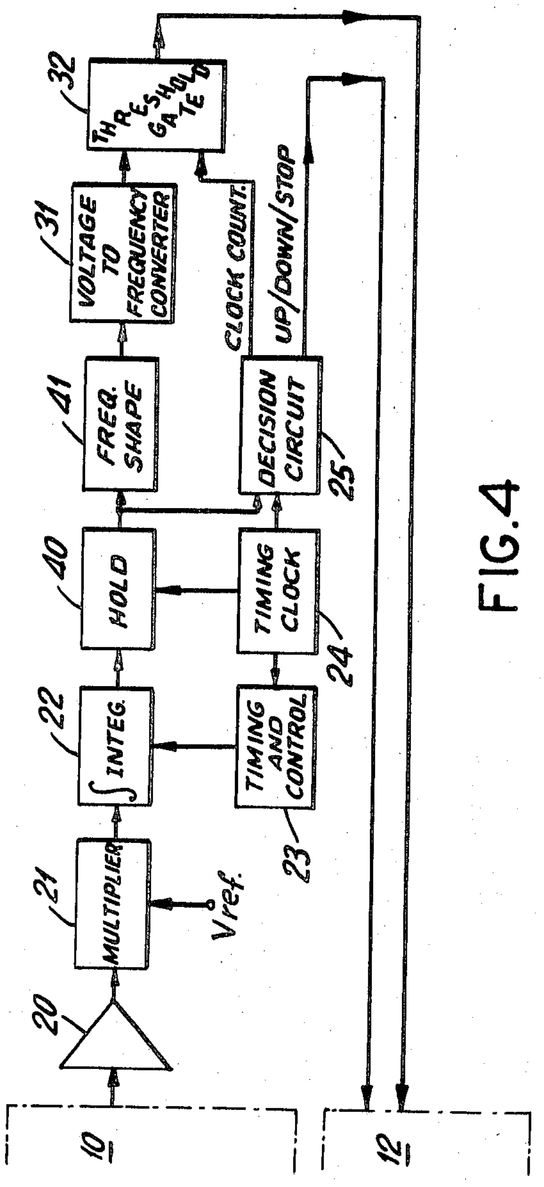
FIG. 4 is a schematic block diagram illustrating alternate null detection and processing arrangements which include the features of the system of FIGS. 1 and 3.

FIG. 4 schematically illustrates another combination of the integrating techniques of FIGS. 1 and 2 and the voltage/frequency conversion techniques of FIG. 3. Amplifier 20, multiplier 21, integrator 22, timing and control circuit 23 and clock 24 operate as previously described. However, the integrator output is stored by a holding circuit 40 between sampling periods when the converter 31 is operative. This provides a continuous signal for application to the converter, the intervals between sampling now being occupied by the stored integrator sample.

The converter 31 receives this signal via a frequency shaping network 41 used for response modification as required. The converter output supplies the threshold gate 32 which operates as a mode switch as hereinbefore described. The decision circuit 25 also operates as previously noted.

It may be seen from the foregoing that the introduction of integrating and voltage-to-frequency conversion techniques in analog/digital systems yields significant advantages in system performance. High accuracy and rapid response are obtained concurrently without the usual circuit complexity or compromises attending the establishment of such features.

In the study and practice of the invention, modifications will undoubtedly occur to those skilled in the art. The invention is accordingly not limited to the specific mechanisms shown and described, but departures may be made therefrom within the scope of the accompanying claims.

I claim:

1. In apparatus for processing dynamically changing analog data to derive digital output data representing a function of said analog data, said apparatus comprising:

A. a closed loop system having;

1. comparator-detector means, said comparator-detector means comprising, a. means for receiving said input analog data, b. means for receiving feedback data,
c. error processing means operatively connected and responsive to said input and feedback receiving means for deriving an AC error signal of amplitude modulated carrier form,
d. said error processing means including means for suppressing the effects of carrier harmonics on said error signal, 2. means connected to be controlled by said error processing means for deriving a control signal,
3. means responsive to said control signal for generating digital data,
4. digital-analog converter means responsive to said generated digital data, and
5. means coupling said converter means to said feedback receiving means of said comparator-detector means for reducing said error signal to a null condition; and B. means responsive to said digital generating means for supplying said digital output data, the improvement comprising;

C. harmonic suppression means for improving the dynamic performance of said system without a concomitant degradation in accuracy, said suppression means comprising means connected in the circuit of said error processing means for multiplying and integrating said AC error signal to suppress harmonics of said carrier.

2. Apparatus according to claim 1 including threshold gating means connected in said loop to be responsive to said error signal for opening said closed loop during null conditions.

3. Apparatus according to claim 1 in which said analog data comprises AC electrical data, and said means for receiving said input analog data comprises means for receiving input AC electrical analog data.

4. Apparatus according to claim 3 in which said AC electrical data comprises resolver signals.

5. Apparatus according to claim 3 including threshold gating means connected in said loop to be responsive to said error signal for opening said closed loop during null conditions.

6. Apparatus according to claim 5 in which said AC electrical data comprises resolver signals.

7. Apparatus according to claim 1 in which said analog data comprises mechanical input data, and said comparator-detector means includes mechanical-to-electrical transducing means.

8. Apparatus according to claim 7 in which said mechanical input data comprises shaft angle.

9. Apparatus according to claim 7 including threshold gating means connected in said loop to be responsive to said error signal for opening said closed loop during null conditions.

10. Apparatus according to claim 9 in which said mechanical input data comprises shaft angle.